(12) United States Patent
Alam et al.

(10) Patent No.: US 12,732,167 B2
(45) Date of Patent: Sep. 8, 2026

(54) ROBUST SINGLE EVENT UPSET (SEU) TOLERANT HIGH-PERFORMANCE FLIP-FLOP

(71) Applicant: XILINX, INC., San Jose, CA (US)

(72) Inventors: Tabrez Alam, Hyderabad (IN); Kumar Rahul, Hyderabad (IN); Santosh Yachareni, Hyderabad (IN); Ishtiaque Ahmad, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 18/889,154

(22) Filed: Sep. 18, 2024

(65) Prior Publication Data

US 2026/0081585 A1 Mar. 19, 2026

(51) Int. Cl.

*H03K 3/037* (2006.01)
*H03K 3/3562* (2006.01)
*H03K 19/08* (2006.01)
*H03K 19/094* (2006.01)

(52) U.S. Cl.

CPC ....... *H03K 3/0372* (2013.01); *H03K 3/35625* (2013.01); *H03K 19/0806* (2013.01); *H03K 19/09425* (2013.01)

(58) Field of Classification Search

CPC ............. H03K 3/0372; H03K 3/35625; H03K 19/0806; H03K 19/09425
USPC ....... 327/208, 209, 212, 215, 218, 219, 199, 327/202; 326/46
See application file for complete search history.

(56) References Cited

U.S. PATENT DOCUMENTS 8,729,640 B2 5/2014 Morris
11,552,622 B1 * 1/2023 Pham ................ H03K 3/35625

OTHER PUBLICATIONS

Technical Article the I2C Bus: When to Use an I2C Buffer Aug. 20, 2018 by Stephen St. Michael (Year: 2018).*
Berg, M.D., et al."Revisiting Dual Interlocked Storage Cell (DICE) Single Event Upset (SEU) Sensitivity," NASA/GSFC, Presented by Melanie Berg at the Microelectronics Reliability & Qualification Working Meeting (MRQW) 2013 and HiREV Industry Day, El Segundo, CA, Dec. 10-12, 2013 and published on nepp.nasa.gov.
Schwartz, H. R. , et al., "Single-event upset in flash memories," in IEEE Transactions on Nuclear Science, vol. 44, No. 6, pp. 2315-2324, Dec. 1997.
Márquez, F., et al. "Design Optimization of a Dual-Interlocked-Cell in 65 Nm CMOS Tolerant to Single Event Upsets." Journal of Instrumentation, vol. 18, No. 10, 2023, pp. 0-17.

* cited by examiner

*Primary Examiner* — Arnold M Kinkead
(74) *Attorney, Agent, or Firm* — Patterson + Sheridan, LLP

(57) ABSTRACT

Embodiments herein describe single event upset (SEU) tolerant flip-flop that includes master latch circuitry, slave latch circuitry, and a tristate driver having an input coupled to an output of the master latch circuitry and an output coupled to a first data input of the slave latch circuitry, where the first tristate driver is configured to inhibit charge transfer from the first data input of the slave latch circuitry to the output of the master latch circuitry.

19 Claims, 8 Drawing Sheets

ROBUST SINGLE EVENT UPSET (SEU) TOLERANT HIGH-PERFORMANCE FLIP-FLOP

TECHNICAL FIELD

Examples of the present disclosure generally relate to describe a robust single event upset (SEU) tolerant high performance flip-flop.

BACKGROUND

A flip-flop (FF) may be designed with redundancy features (e.g., redundant storage nodes) to protect against radiation-induced singe event upsets (SEUs). Such an FF may be referred to as a radiation-hardened FF, a SEU tolerant FF, and/or a SEU FF.

An internal master latch node of an SEU FF may have a poor noise margin due to charge transfer feedback from a slave portion of the SEU FF. The poor noise margin may result in write failures on an internal latch node of the SEU FF, which may reduce reliability of the SEU FF.

SUMMARY

Techniques for a robust single event upset (SEU) tolerant high performance flip-flop are described. One example described herein is an integrated circuit that includes a master-slave latch circuit having master latch circuitry, slave latch circuitry, and a tristate driver having an input coupled to an output of the master latch circuitry and an output coupled to a data input of the slave latch circuitry, where the tristate driver inhibits charge transfer from the data input of the slave latch circuitry to the output of the master latch circuitry.

Another example described herein is an integrated circuit that includes a master-slave latch circuit having master latch circuitry, slave latch circuitry, and a tristate driver having an input coupled to an output of the master latch circuitry and an output coupled to a data input of the slave latch circuitry, where the tristate driver includes an inverter circuit that inverts the output of the master latch circuitry, a pull-up transistor that provides a supply voltage to the inverter circuit based on a clock, and a pull-down transistor that provides a reference voltage to the inverter circuit based on an inverse of the clock.

Another example described herein is an integrated circuit device that includes a field-programmable gate array (FPGA) having random access memory (RAM) circuitry, where the RAM circuitry includes a dual double interlocked storage cell (DICE), and where the DICE includes master latch circuitry, slave latch circuitry, and a tristate driver having an input coupled to an output of the master latch circuitry and an output coupled to a data input of the slave latch circuitry, where the tristate driver inhibits charge transfer from the data input of the slave latch circuitry to the output of the master latch circuitry.

BRIEF DESCRIPTION OF DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
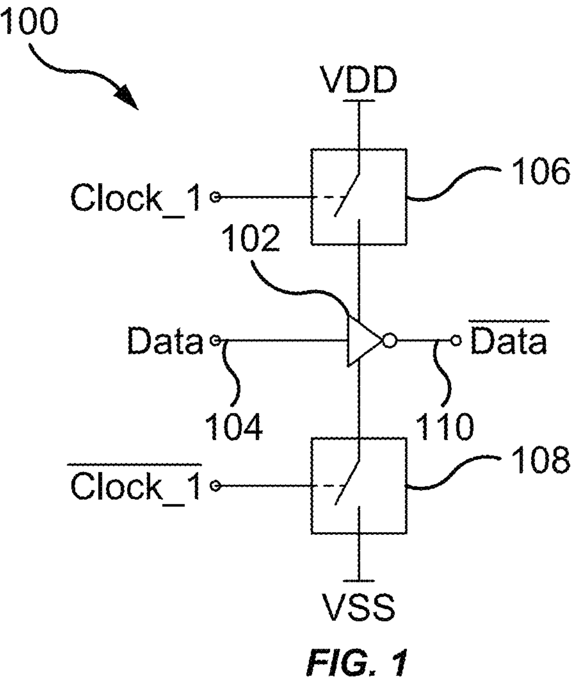
FIG. 1 depicts a tristate driver, according to an embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe a robust single event upset (SEU) tolerant high performance flip-flop.

The noise margin of an internal master latch node of a SEU FF may be improved with increased clock driver sizes, at a cost of increased power and area requirements. The noise margin of an internal master latch node of a SEU FF may also be improved with variations in transistor threshold voltages.

As disclosed herein, the noise margin of an internal master latch node of back-to-back latches (e.g., a SEU FF) is improved with a tristate driver between master and slave circuitry. The tristate driver reduces or precludes noise/charge flow from the slave circuitry to the master circuitry, and thus improves a signal noise margin (SNM) of the master circuitry, and SEU tolerance. A tristate driver based SEU FF may useful in a variety of circuits such as, without limitation, a dual double interlocked storage cell (DICE), random access memory (RAM), such as block RAM (BRAM) and ultra-RAM (UAM), timing paths, and field-programmable gate arrays (FPGAs). A tristate driver based SEU FF may be useful in applications that require high-performance SEU tolerant FFs, such as extraterrestrial applications (e.g., satellites/spacecraft), aviation applications, and military applications.

FIG. 1 depicts a tristate driver 100, according to an embodiment. As described below, an output 110 of tristate driver 100 has three electrical states, high (e.g., a supply voltage or VDD), low (e.g., a reference voltage or ground), and open/disconnected. In the open/disconnected state, absent other driver circuitry coupled to output node 110, tristate driver 100 may appear as a high impedance from the perspective of output node 110.

Tristate driver 100 includes a buffer 102, illustrated here as an inverter that inverts a logic state of a data input 104. Tristate driver 100 further includes a first switch circuit 106 that selectively provides a supply voltage VDD to buffer 102 based on a clock, illustrated here as Clock_1. Tristate driver 100 further includes a second switch circuit 108 that selectively provides a reference voltage VSS (e.g., ground) to buffer 102 based on an inverse of Clock_1.

When Clock_1 is low (e.g., VSS), switch circuits 106 and 108 close to provide VDD and VSS to buffer 102, and buffer 102 outputs an inverted state of data input 104 at a data output 110. When Clock_1 is high (e.g., VDD), switch circuits 106 and 108 open to isolate VDD and VSS from buffer 102. In this state, charge flow (e.g., noise) from data output 110 to data input 104 is restricted and/or precluded.

Figure 2:
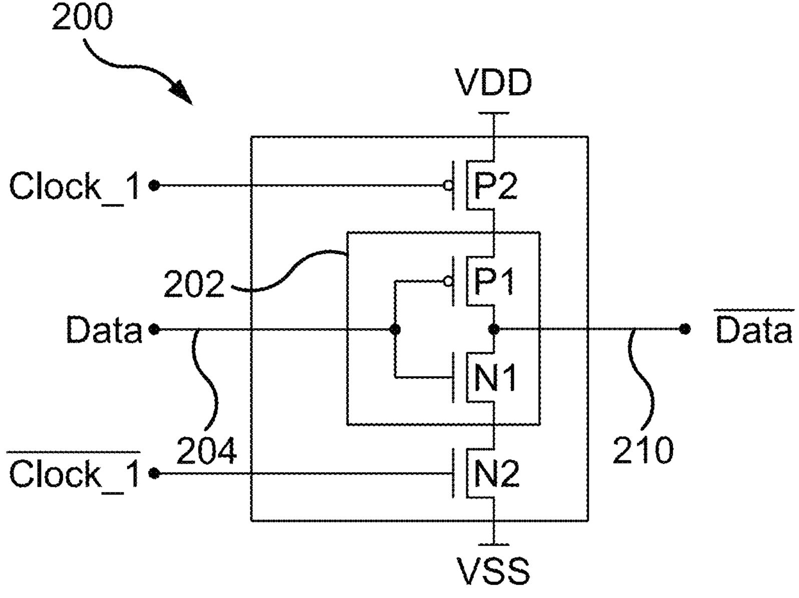
FIG. 2 is a schematic diagram of the tristate driver of FIG. 1, according to an embodiment.

FIG. 2 is a schematic diagram of a tristate driver 200, according to an embodiment. Tristate driver 200 represents an example implementation of tristate driver 100. Tristate driver 100 is not, however, limited to the example of FIG. 2.

Tristate driver 200 includes an inverting buffer 202 that includes a p-type transistor P1 and an n-type transistor N1, to invert a logic state of a data input 204. Tristate driver 200 further includes a first switch circuit, depicted here as a transistor P2 that selectively provides supply voltage VDD to inverter 202 based on clock_1. Tristate driver 200 further includes a second switch circuit, depicted here as a transistor N2 that selectively provides reference voltage VSS to inverter 202 based on an inverse of Clock_1.

In the example of FIG. 2, data input 204 is coupled to gates of P1 and N1, and data output 210 is coupled to a source of P1 and a drain of N1. Data input 204 and data output 210 are thus effectively isolated from one another (i.e., noise/charge flow from a source to a gate of P1, and from a drain to a gate of N1, is restricted/inhibited and/or precluded).

When Clock_1 is low, P2 and N2 turn on (i.e., saturation mode) to provide VDD and VSS to inverter 202. If the logic state of data input 204 is high, P1 is off (i.e., cutoff mode), N1 turns on, and data output 210 is pulled down to VSS via N1 and N2. If the logic state of data input 204 is low, N1 is off, P1 turns on, and data output 210 is pulled up to VDD via P1 and P2.

When Clock_1 is high, P2 and N2 are off, which isolates inverter 202 from VDD and VSS. In this situation, buffer 202 does not propagate/invert data from data input 204 to output 210. Rather, data output 210 is open/disconnected. As described further below, in this state, data output 210 may be driven by other circuitry, such as a keeper circuit of a flip-flop, and the state of tristate driver circuit 200 may be referred to a latch/hold mode.

A tristate driver, such as depicted in FIG. 1 and/or FIG. 2, may be useful in a variety of applications such as, without limitation, a master-slave latch circuit, examples of which are provided below.

Figure 3:
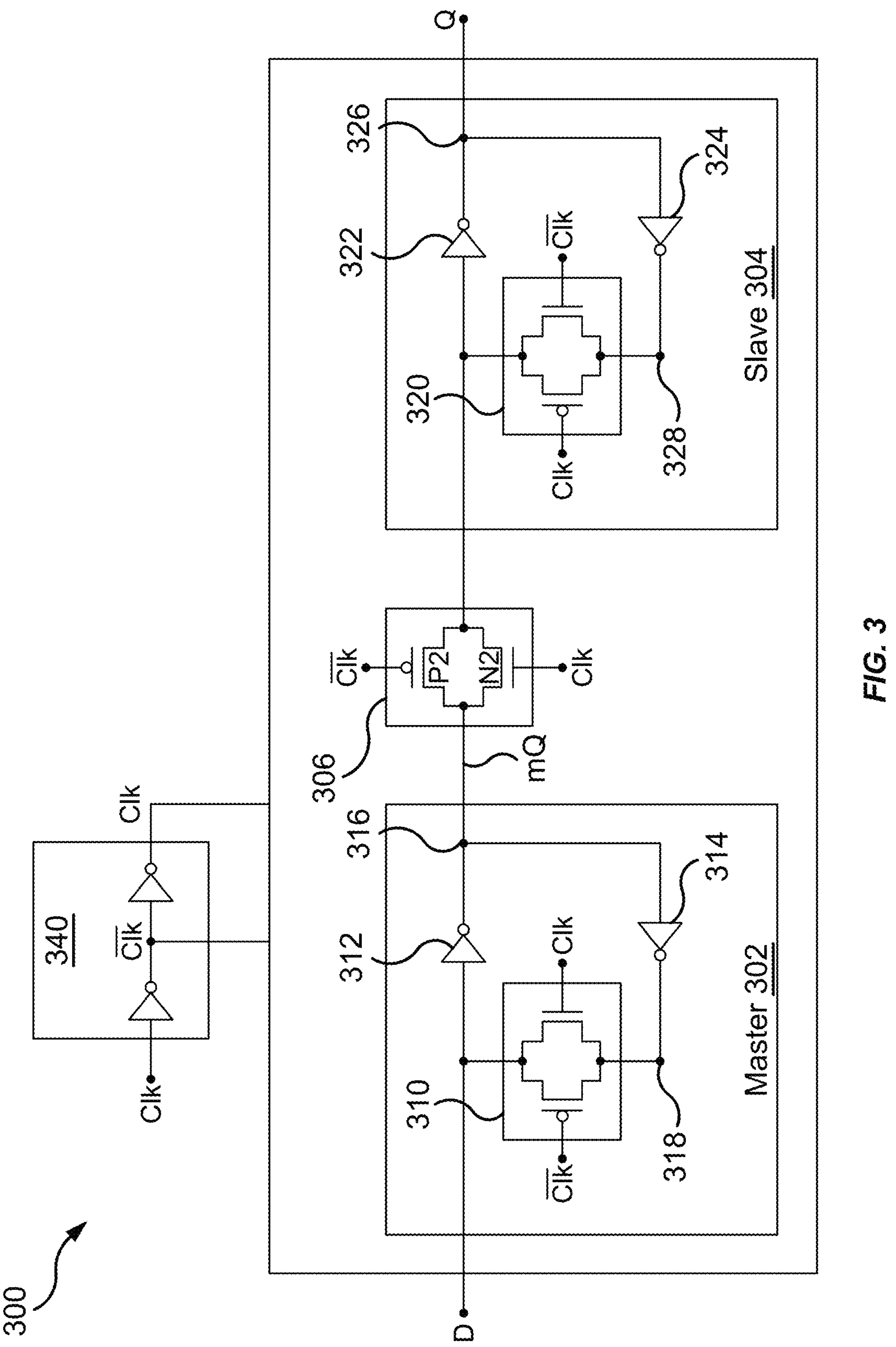
FIG. 3 depicts master-slave latch circuit.

FIG. 3 depicts master-slave latch circuit (circuit) 300. Circuit 300 includes a master circuit 302, a slave circuit 304, a transmission gate 306, and clock circuitry 340. Master circuit 302 and slave circuit 304 are depicted here as edge-triggered flip-flops, or cascaded latches. Master circuit 302 includes a master keeper circuit 310 and cross-coupled inverters 312 and 314. Slave circuit 304 includes a slave keeper circuit 320 and cross-coupled inverters 322 and 324.

On a rising edge of a clock Clk, master keeper circuit 310 is enabled and cross-coupled inverters 312 and 314 capture/latch opposing states of input data D at respective nodes 316 and 318. While clock Clk is high, transmission gate 306 is enabled, and transmission gate 306 passes data mQ from node 316 to slave circuit 304. Also while clock Clk is high, slave keeper circuit 320 is disabled and slave circuit 304 is in a transparent mode in which inverter 322 inverts mQ to output data Q (i.e., data D).

On a falling edge of clock Clk, slave keeper circuit 320 is enabled and cross-coupled inverters 312 and 314 capture/latch opposing states of data mQ at respective nodes 326 and 328. While clock Clk is low, master keeper circuit 310 is disabled and master circuit 302 operates in a transparent mode in which inverter 312 outputs the inverse of data D as data mQ. Also while clock Clk is low, transmission gate 306 is disabled and does not pass data mQ to slave circuit 304.

Circuit 300 may include multiple transmission gates 306, and multiple corresponding slave circuits 304 and clock circuits 340, such as to provide a dual double interlocked storage cell (DICE), or DICE latch. DICE latches have redundant storage nodes and restore the original cell state when an single event upset (SEU) error is introduced in one of the nodes. The probability of multiple critical nodes being affected simultaneously is low, making the DICE latch tolerant to SEUs. DICE latches are thus useful for radiation hardening.

As manufacturing/fabrication technologies progress towards smaller devices, DICE latches may become more prone to SEUs and/or SEU-equivalent events due to charge sharing amongst the redundant nodes (e.g., with decreasing physical space between the nodes). SEU-equivalent events are described below with reference to FIGS. 3 and 4.

Figure 4:
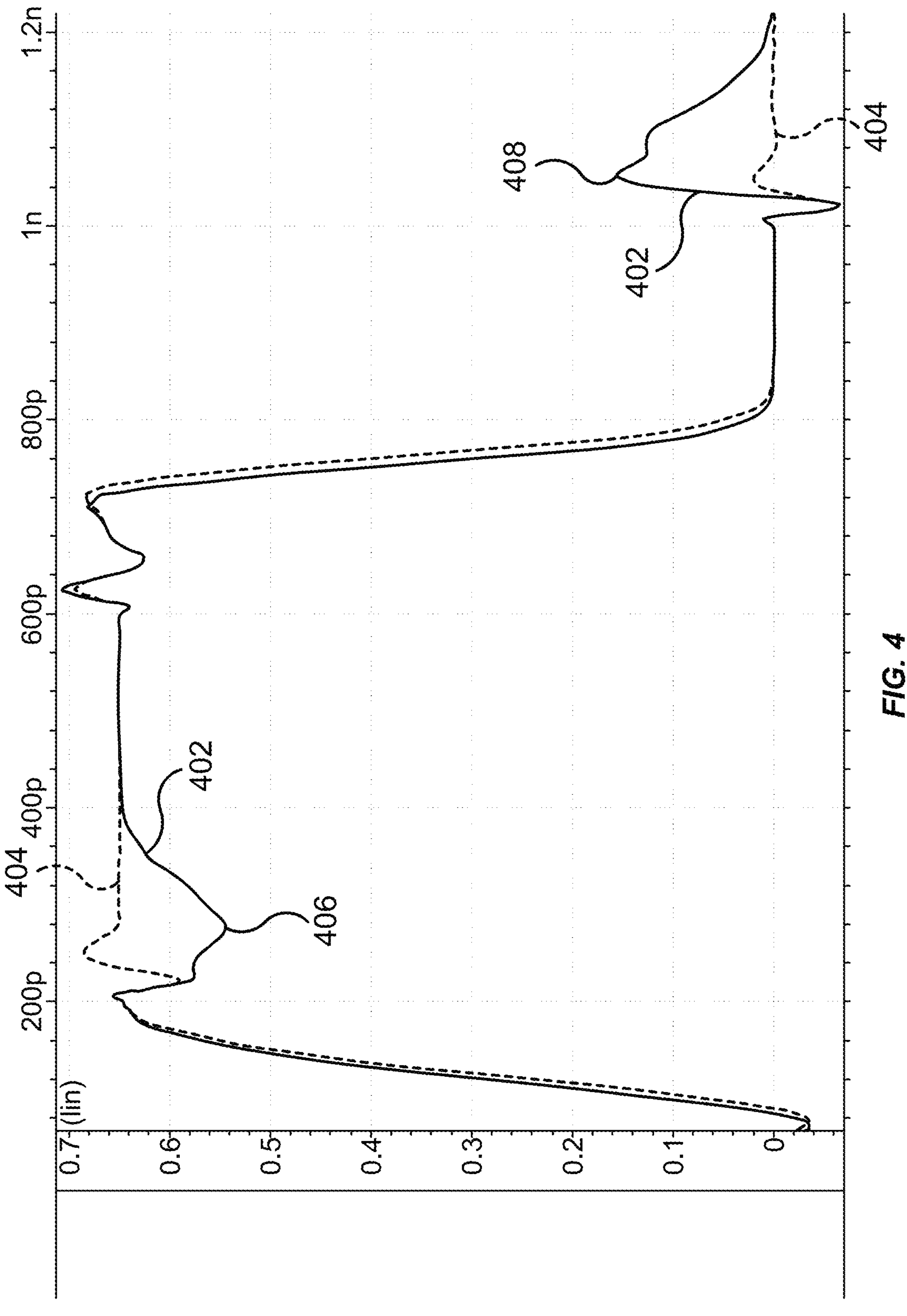
FIG. 4 depicts simulated timing diagrams, according to an embodiment.

FIG. 4 depicts simulated timing diagrams 402 and 404, according to an embodiment. Simulated timing diagram 402 corresponds to an internal master latch node (e.g., node 316 in FIG. 3) of a DICE that includes transmission gate 306. Simulated timing diagram 404 corresponds to an internal master latch node of a DICE that includes a tristate driver, such as depicted in FIG. 1 and/or FIG. 2. Simulated timing diagram 402 is discussed below. Simulated timing diagram 404 is discussed further below.

Timing diagram 402 includes an asymmetric dip 406 when inverter 312 asserts a logic "1" at node 316, and an asymmetric bump 408 when inverter 312 asserts a logic "0" at node 316 (i.e., a "ground" bump). Dip 406 and bump 408 represent noise (e.g., charge flow due to switching activity) transferred from slave circuit 304 via transmission gate 306. In the example of FIG. 4, dip 406 corresponds to a voltage drop of approximately 106 millivolts (mV), which may represent approximately 16% of a supply voltage. Bump 408 corresponds to a ground voltage bump of approximately 155 mV, which may represent approximately 24% of the supply voltage. The foregoing voltages may vary based on operating voltages and/or process variations. Dip 406 and bump 408 reduce the signal noise margin (SNM) of the internal master latch node, which reduces SEU tolerance. At a lower operating voltages, impacts of dip 406 and/or ground bump 408 may be more pronounced.

In some situations (e.g., due to process variations), dip 406 and/or bump 408 may cause cross-coupled inverter 314 to write an incorrect state to node 318, which may flip a logic state of node 316, similar to a SEU-induced bit flip. Dip 406 and/or bump 408 may thus be referred to as SEU-equivalent events or phenomena. SEU-equivalent phenomena may impact the reliability of an otherwise SEU-tolerant device. As disclosed below, transmission gate 306 may be replaced with tristate driver to reduce and/or preclude charge flow from a slave circuit to a master circuit.

Figure 5:
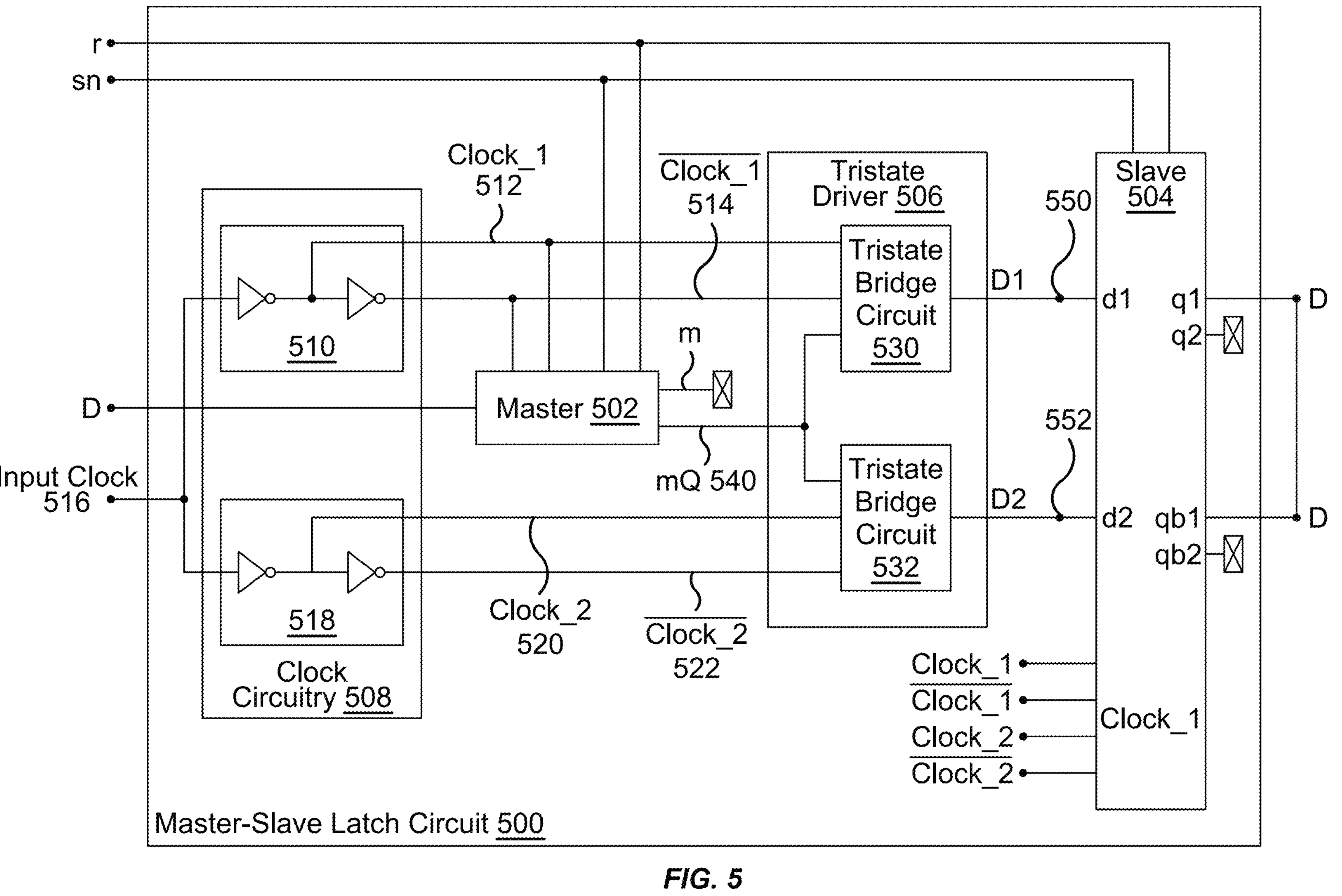
FIG. 5 depicts master-slave latch circuit that includes a tristate driver, according to an embodiment.

FIG. 5 depicts master-slave latch circuit (circuit) 500, according to an embodiment. Circuit 500 may operate/function as a D-type flip-flop and/or may represent a DICE. Circuit 500 includes a master circuit 502, a slave circuit 504, tristate driver 506, and clock circuitry 508. Tristate driver 506 includes tristate drivers 530 and 532.

Clock circuitry 508 includes a first clock circuit 510 that generates a clock_1 512 and an inverse of clock_1 514, based on an input clock 516. Clock circuitry 508 further includes a second clock circuit 518 that generates a clock_2 520 and an inverse of clock_2 522, based on input clock 516. In the example of FIG. 5, clock_1 512 and clock_2 520 are the inverse of input clock 516.

Figure 6:
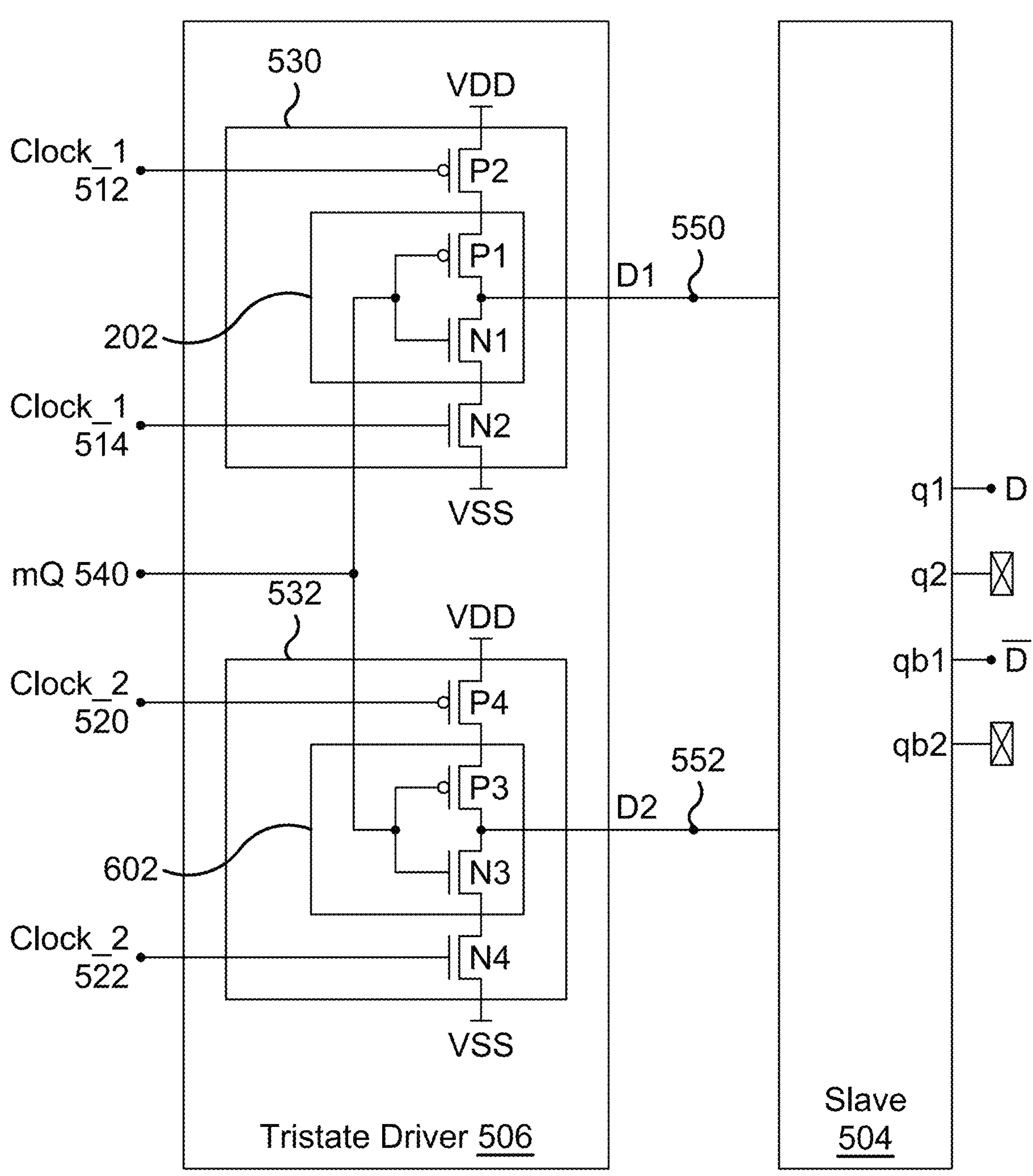
FIG. 6 is a schematic diagram of the tristate driver of FIG. 5, according to an embodiment.

FIG. 6 is a schematic diagram of tristate driver 506, according to an embodiment. In the example of FIG. 6, tristate driver 530 includes transistors P1, N1, P2, and N2, as described above with reference to tristate driver 200 in FIG. 2. Tristate driver 532 includes transistors P3, N3, P4, and N4, arranged similar to transistors P1, N1, P2, and N2 of tristate driver 530. As described further above with respect to FIG. 2, tristate drivers 530 and 532 inhibit and/or preclude charge transfer from slave circuitry 504 to master circuit 502.

Clock circuits 510 and 518 may be physically identical to one another, such that clock_1 512 and clock_2 520 are substantially identical to one another, and such that the inverse of clock_1 514 and the inverse of clock_2 522 are substantially identical to one another. Tristate drivers 530 and 532 may be physically identical to one another such that, absent a SEU, outputs D1 and D2 of tristate drivers 530 and 532 are identical to one another. Clock circuits 510 and 518 may be physically placed in separate respective regions of an integrated circuit die. Similarly, tristate drivers 530 and 532 may be physically placed in separate respective regions of the integrated circuit die. Similarly, portions of slave circuit 504 associated with tristate driver 530, and portions of slave circuit 504 associated with tristate driver 532 may be identical to one another and may be physically placed in separate respective regions of the integrated circuit die. Placing redundant circuits in separate respective regions of the integrated circuit die may be useful to avoid multiple redundant circuits from being impacted by the same radiation event.

When input clock 516 is low, master circuit 502 outputs the inverse of data D as data mQ at an mQ node 540 (i.e., master circuit 502 is in a transparent mode), tristate drivers 530 and 532 are disabled (i.e., transistors P2, N2, P4, and N4 are off), and slave circuitry 504 is in a hold state in which slave circuitry 504 retains prior states of D1 and D2 that that slave circuitry 504 previously captured/latched from nodes 550 and 552. In this state, slave circuitry 504 asserts the previously captured/latched states of D1 and D2 at outputs q1 and qb1. Also in this state, tristate drivers 530 and 532 are essentially in a latch/hold mode through keeper circuits of slave circuitry 504, and logic states of nodes 550 and 552 are driven by the keeper circuits of slave circuitry 504.

On a rising edge of input clock 514, master circuit 302 captures/latches data D, and continues outputting the inverse of data D at mQ node 540. Also on the rising edge of input clock 514 (i.e., falling edges of clocks clock_1 512 and clock_2 520), transistors P2, N2, P4, and N4 turn on, and inverters 202 and 602 output the inverse of data mQ as data D1 and D2, respectively. While input clock 514 is high, slave circuitry 504 is in the transparent state in which slave circuitry 504 provides the inverse of data D1 and D2 at respective outputs q1 and q2.

States of circuit 500 are depicted in Table 1, below, for various states of input clock 514 and data mQ at mQ node 540.

TABLE 1

| | Case 1: Input Clock 516 High (i.e., Clock_1 and Clock_2 Low) | | Case 2: Input Clock 516 Low (i.e., Clock_1 and Clock_2 High) | |
|---|---|---|---|---|
| | Case 1a | Case 1b | Case 2a | Case 2b |
| Master Circuit 502 | Hold | Hold | Transparent | Transparent |
| Slave Circuit 504 | Transparent | Transparent | Hold | Hold |
| P2, N2, P4, N4 | On | On | Off | Off |
| Data mQ 550 | 1 | 0 | 1 | 0 |
| Nodes 550, 552 (D1, D2) | 0 | 1 | * | * |

* States of nodes 550, 552 (D1, D2) depend on prior states captured by slave circuitry 504

Returning to FIG. 4, simulated timing diagram 404 illustrates that a tristate driver mitigates and/or precludes bumps/dips due to charge transfer from the slave circuitry. In the example of FIG. 4, the tristate driver reduces ground bump noise from 24% to 3%, and reduces dip noise from 16% to 3%. The reductions in ground bump and dip noise improves SNM, signal swing on internal latch nodes, and overall SEU tolerance. Tristate driver improvements are not limited to the examples of FIG. 4.

A tristate driver may also promote timing improvements. In an example, a SEU FF may be used in a CLK-to-Out path (i.e., a path mQ node 540 to output nodes D and D of a random-access memory (RAM) block (e.g., block RAM or ultra-RAM). A delay of the CLK-to-Out path as input clock 516 rises may be relatively high, which may degrade the CLK-to-Out path in a register (REG) mode. A tristate driver, as disclosed herein, may reduce delay in the CLK-to-Out path, while preserving SEU tolerance. A tristate driver, as disclosed herein, may increase speed (i.e., reduce delay) by up to 28% or more for devices having Standard Threshold Voltage (SVT). Clk-to-Out delay may be reduced further with Low Threshold Voltage (LVT) devices, but with a possible increase in leakage current.

In some situations, the worst case delay is CLK-rise-to-output fall. A tristate driver, as disclosed herein, may improve CLK rise-to-output fall times by up to 38% or more. Increasing the size of drivers of clock circuit 510 may reduce Clk-to-Out delay, and/or may balance Clk-to-Out rise and fall times. Increasing the size of drivers of clock circuit 510 may increase a gain in the Clk-to-Out path, which would otherwise be degraded due to dips/bumps on internal master latch nodes.

As an example, in FIG. 5, a fanout on Clock_1 512 is higher than a fanout on Clock_2 520 (i.e., Clock_1 512 is provided to master circuitry 502, in addition to tristate driver circuit 506 and slave circuitry 504). This results in a timing penalty for one of the edges of Clock_1 512. The timing penalty may be reduced/eliminated by increasing sizes of drivers of clock circuit 510 relative to drivers of clock circuit

518. Increasing sizes of drivers of clock circuit 510 may increase the number of fins of devices falling in an active path of Clock_1 512. Increasing sizes of drivers of clock circuit 510 may improve performance/access times in REG mode. Improved CLK-to-Out of may permit downsizing of internal CLK drivers and may reduce dynamic power consumption in RAM circuitry (e.g., BRAM and URAM).

Figure 7:
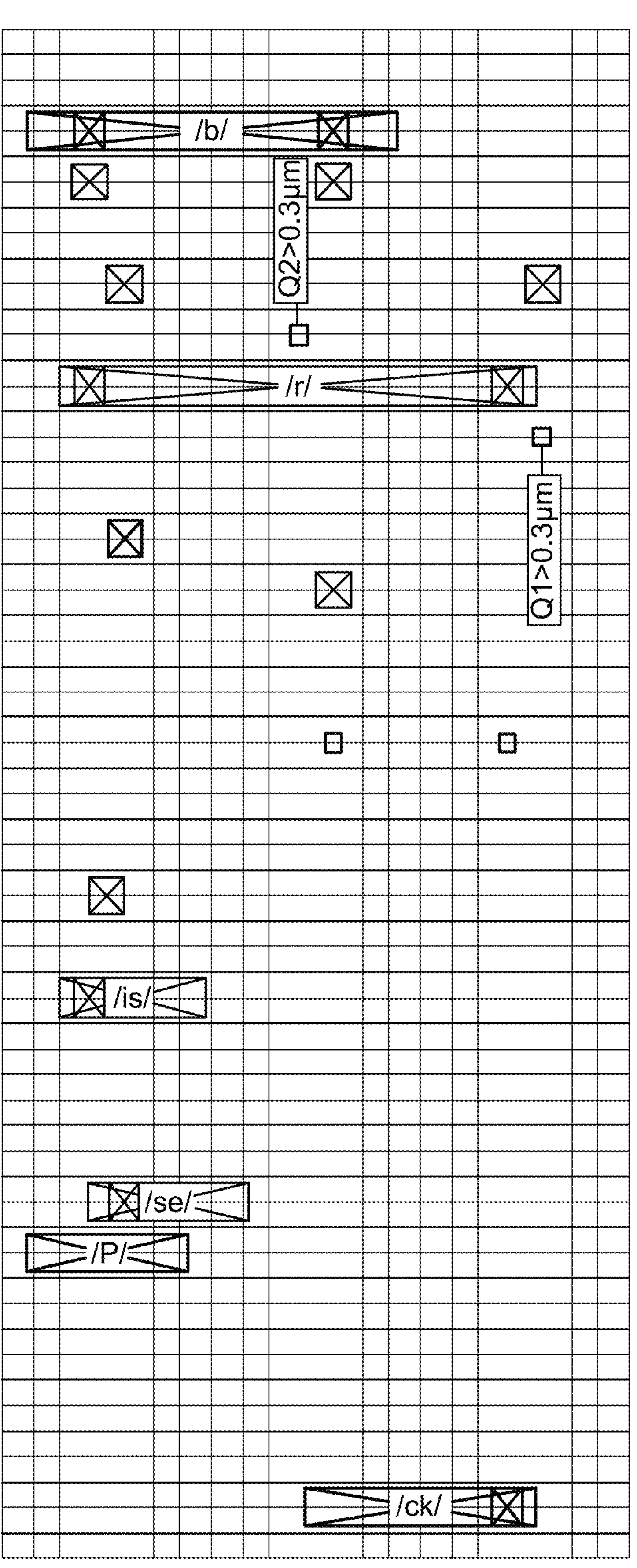
FIG. 7 depicts a physical layout of the master-slave latch circuit of FIG. 5, according to an embodiment.

FIG. 7 depicts a physical layout of circuit 500, according to an embodiment. The example of FIG. 7 represents a 29 poly-pitch (PP) design that reduces noise on the internal master latch node from 45% to 3%, with an increase in area of approximately 10%. In the example of FIG. 7, nodes Q1 and Q2 (i.e., corresponding to outputs q1 and qb1 of slave circuitry 504 in FIG. 5) are physically separated from one another by at least 0.3 micrometers. Circuit 500 is not limited to the example of FIG. 7.

Figure 8:
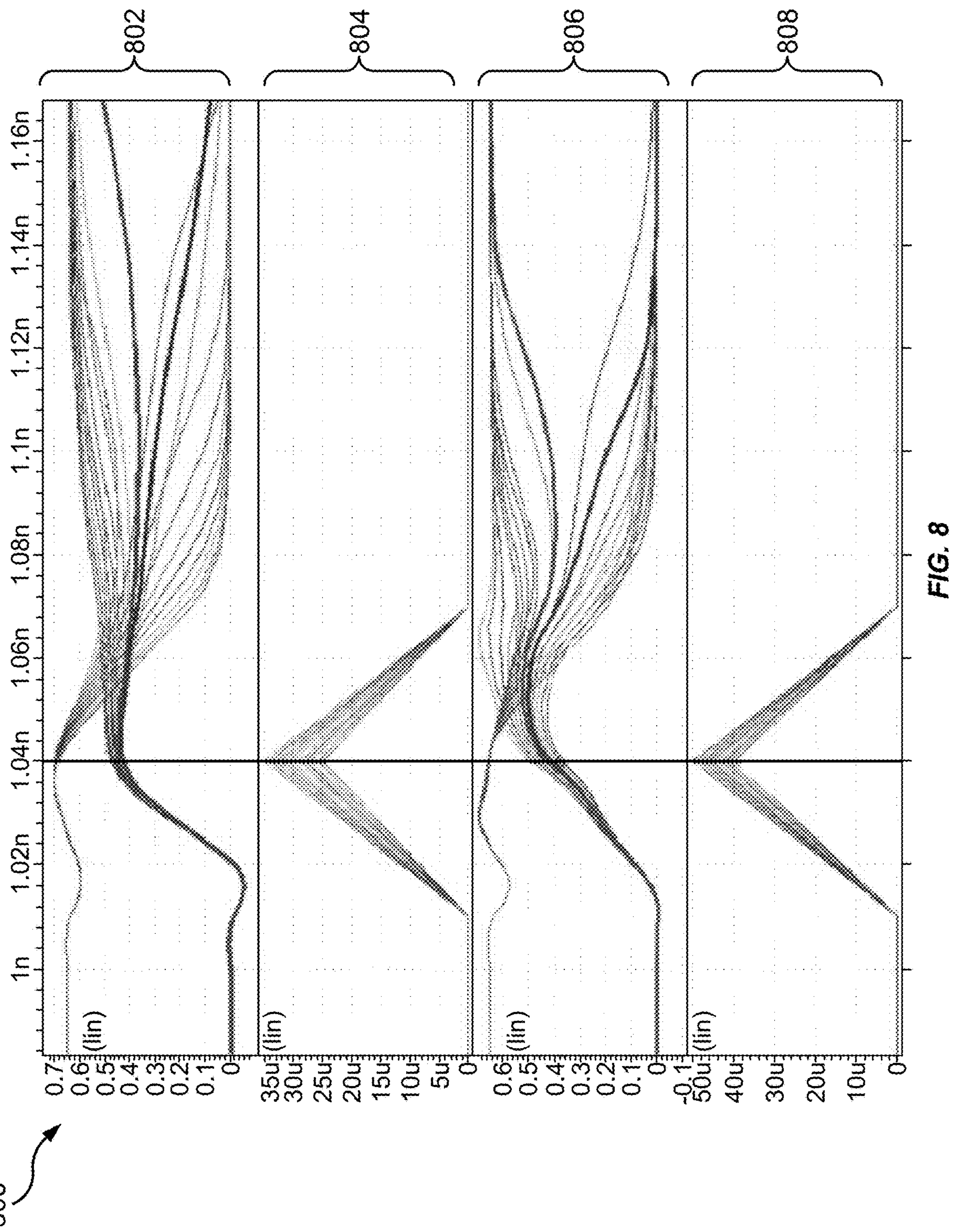
FIG. 8 depicts simulated graphs for a first DICE that includes a transmission gate, and simulated graphs for a second DICE that includes a tristate driver, according to an embodiment.

FIG. 8 depicts simulated graphs 802 and 804 for a first DICE that includes a transmission gate (e.g., transmission gate 306), and simulated graphs 806 and 808 for a second DICE that includes a tristate driver (e.g., tristate driver 506), according to an embodiment. Graphs 804 depict simulated currents applied to a mq node of the first DICE. Graphs 802 depicts corresponding simulated states of an internal master latch nodes of the first DICE. Graphs 808 depict simulated currents applied to a mq node of the second DICE. Graphs 806 depicts corresponding simulated states of an internal master latch node of the second DICE. As illustrated in graphs 800, the first DICE incurs bit flips at 27 micro amperes (μA), whereas the second DICE does not incur bit flips until 45 μA. In other words, it takes approximately 40 to 50% more current to cause bit flips in the second DICE.

Figure 9:
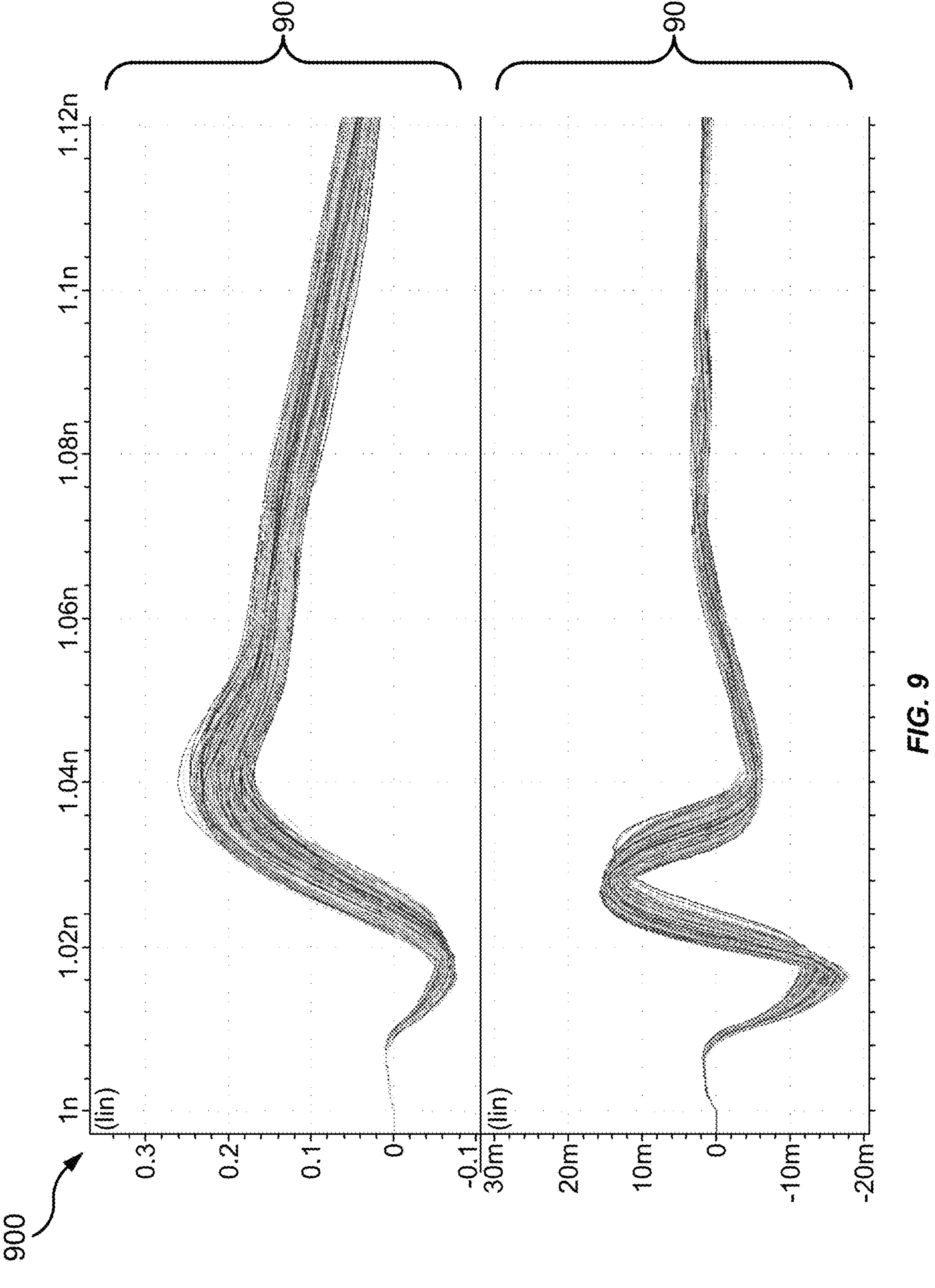
FIG. 9 depicts graphs of ground bump impacts on noise on internal master latch nodes of the first and second DICE, respectively, based on Monte Carlo simulation, according to an embodiment.

FIG. 9 depicts graphs 902 and 904 of ground bump impacts on noise on internal master latch nodes of the first and second DICE, respectively, based on Monte Carlo simulation, according to an embodiment. Magnitudes of graphs 904 are scaled up, relative to graphs 902, for illustrative purposes. In graphs 902, ground bump go from zero to approximately 0.27 volts at SF_0.65V_T-40, resulting in noise of approximately 45% of VDD. Whereas, in graphs 904, ground bump noise is within 3% of VDD.

Providing a DICE with tristate drivers, as disclosed herein, may increase area overhead by as little as 12% or less.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. An integrated circuit, comprising:

a master-slave latch circuit comprising:

master latch circuitry comprising a data input configured to receive data and a data output configured to output the data;

slave latch circuitry; and a first tristate driver comprising a data input configured to receive the data from the data output of the master latch circuitry, and a data output coupled to a first data input of the slave latch circuitry;

wherein the first tristate driver comprises:

an inverter circuit configured to invert the data output of the master latch circuitry;

a pull-up transistor configured to provide a supply voltage to the inverter circuit based on a first clock; and a pull-down transistor configured to provide a reference voltage to the inverter circuit based on an inverse of the first clock; and wherein the first tristate driver is configured to inhibit charge transfer from the first data input of the slave latch circuitry to the data output of the master latch circuitry.

2. The integrated circuit of claim 1, wherein:

a logic state of the data output of the first tristate driver is based on the data output of the master latch circuitry when a first clock is at a first state, and is based on a state of a storage node of the slave latch circuitry when the first clock is at a second state.

3. The integrated circuit of claim 1, further comprising:

a second tristate driver comprising a data input coupled to the data output of the master latch circuitry, and a data output coupled to a second data input of the slave latch circuitry;

wherein the second tristate driver is configured to inhibit charge transfer from the second data input of the slave latch circuitry to the data output of the master latch circuitry.

4. The integrated circuit of claim 3, wherein the second tristate driver comprises:

a second inverter circuit configured to invert the data output of the master latch circuitry;

a second pull-up transistor configured to provide the supply voltage to the second inverter circuit based on a second clock; and a second pull-down transistor configured to provide the reference voltage to the second inverter circuit based on an inverse of the second clock.

5. The integrated circuit of claim 4, further comprising:

a first clock circuit configured to generate the first clock and the inverse of the first clock based on an input clock; and a second clock circuit configured to generate the second clock and the inverse of the second clock based on the input clock;

wherein the first clock circuit comprises a first driver transistor;

wherein the second clock circuit comprises a second driver transistor;

wherein a fanout of the first clock circuit is greater than a fanout of the second clock circuit; and wherein a size of the first driver transistor is greater than a size of the second driver transistor.

6. The integrated circuit of claim 1, wherein:

the first tristate driver is further configured to inhibit charge transfer associated with logic state transitions in the slave latch circuitry.

7. The integrated circuit of claim 1, wherein:

the master-slave latch circuit is configured to mitigate singe event upsets.

8. The integrated circuit of claim 1, wherein:

the master-slave latch circuit is configured as a single event upset (SEU) tolerant flip-flop.

9. The integrated circuit of claim 1, wherein the master-slave latch circuit comprises a dual double interlocked storage cell (DICE).

10. The integrated circuit of claim 1, wherein the first tristate driver is further configured to increase a static noise margin of an internal latch node of the master latch circuitry.

11. An integrated circuit, comprising:

a master-slave latch circuit comprising master latch circuitry, slave latch circuitry, and a first tristate driver having a data input coupled to a data output of the master latch circuitry and a data output coupled to a first data input of the slave latch circuitry;

wherein the first tristate driver comprises:

a first inverter circuit configured to invert the data output of the master latch circuitry;

a first pull-up transistor configured to provide a supply voltage to the first inverter circuit based on a first clock; and a first pull-down transistor configured to provide a reference voltage to the first inverter circuit based on an inverse of the first clock; and wherein the master-slave latch circuit is configured as a single event upset (SEU) tolerant flip-flop wherein the first tristate driver is configured to increase a static noise margin of an internal latch node of the master latch circuitry.

12. The integrated circuit of claim 11, further comprising:

a second tristate driver having a data input coupled to the data output of the master latch circuitry and a data output coupled to a second data input of the slave latch circuitry, wherein the second tristate driver comprises:

a second inverter circuit configured to invert the data output of the master latch circuitry;

a second pull-up transistor configured to provide the supply voltage to the second inverter circuit based on a second clock; and a second pull-down transistor configured to provide the reference voltage to the second inverter circuit based on an inverse of the second clock.

13. The integrated circuit of claim 12, further comprising:

a first clock circuit configured to generate the first clock and the inverse of the first clock based on an input clock; and a second clock circuit configured to generate the second clock and the inverse of the second clock based on the input clock;

wherein the first clock circuit comprises a first driver transistor;

wherein the second clock circuit comprises a second driver transistor; and wherein a fanout of the first clock circuit is greater than a fanout of the second clock circuit; and wherein a size of the first driver transistor is greater than a size of the second driver transistor.

14. The integrated circuit of claim 11, wherein the first tristate driver is configured to increase a static noise margin of an internal latch node of the master latch circuitry master.

15. An integrated circuit device, comprising:

a field-programmable gate array (FPGA), comprising random access memory (RAM) circuitry, wherein the RAM circuitry comprises a dual double interlocked storage cell (DICE), and wherein the DICE comprises master latch circuitry comprising a data input configured to receive data and a data output configured to output the data, slave latch circuitry, and a first tristate driver having a data input coupled to the data output of the master latch circuitry and a data output coupled to a first data input of the slave latch circuitry;

wherein the first tristate driver is configured to inhibit charge transfer from the first data input of the slave latch circuitry to the data output of the master latch circuitry.

16. The integrated circuit device of claim 15, wherein:

a logic state of the data output of the first tristate driver is based on the data output of the master latch circuitry when a first clock is at a first state, and is based on a state of a storage node of the slave latch circuitry when the first clock is at a second state.

17. The integrated circuit device of claim 15, further comprising:

a second tristate driver having a data input coupled to the data output of the master latch circuitry and a data output coupled to a second data input of the slave latch circuitry;

wherein the first tristate driver comprises, a first inverter circuit configured to invert the data output of the master latch circuitry;

a first pull-up transistor configured to provide a supply voltage to the first inverter circuit based on a first clock; and a first pull-down transistor configured to provide a reference voltage to the first inverter circuit based on an inverse of the first clock; and wherein the second tristate driver comprises:

a second inverter circuit configured to invert the data output of the master latch circuitry;

a second pull-up transistor configured to provide the supply voltage to the second inverter circuit based on a second clock; and a second pull-down transistor configured to provide the reference voltage to the second inverter circuit based on an inverse of the second clock.

18. The integrated circuit device of claim 17, further comprising:

a first clock circuit configured to generate the first clock and the inverse of the first clock based on an input clock; and a second clock circuit configured to generate the second clock and the inverse of the second clock based on the input clock;

wherein the first clock circuit comprises a first driver transistor;

wherein the second clock circuit comprises a second driver transistor;

wherein a fanout of the first clock circuit is greater than a fanout of the second clock circuit; and wherein a size of the first driver transistor is greater than a size of the second driver transistor.

19. The integrated circuit device of claim 15, wherein the first tristate driver is further configured to increase a static noise margin of an internal latch node of the master latch circuitry.

* * * * *